(12) United States Patent
Hamada et al.

(10) Patent No.: US 12,532,709 B2
(45) Date of Patent: Jan. 20, 2026

(54) SUBSTRATE PROCESSING APPARATUS

(71) Applicant: SHIBAURA MECHATRONICS CORPORATION, Yokohama (JP)

(72) Inventors: Takahiro Hamada, Yokohama (JP); Osamu Yamazaki, Yokohama (JP)

(73) Assignee: Shibaura Mechatronics Corporation, Yokohama (JP)

( * ) Notice: Subject to any disclaimer, the term of this patent is extended or adjusted under 35 U.S.C. 154(b) by 412 days.

(21) Appl. No.: 18/212,395

(22) Filed: Jun. 21, 2023

(65) Prior Publication Data

US 2023/0420288 A1 Dec. 28, 2023

(30) Foreign Application Priority Data

Jun. 22, 2022 (JP) ................. 2022-100353

(51) Int. Cl.
*H01L 21/687* (2006.01)
*B23Q 1/03* (2006.01)

(52) U.S. Cl.
CPC .......... *H01L 21/68728* (2013.01); *B23Q 1/03* (2013.01)

(58) Field of Classification Search
CPC .. H01L 21/68728; H01L 21/6735; B23Q 3/00
See application file for complete search history.

(56) References Cited

U.S. PATENT DOCUMENTS

| | | | | |
|---|---|---|---|---|
| 9,624,574 B2 * | 4/2017 | Lee | ................. | C23C 14/50 |
| 11,524,392 B2 * | 12/2022 | Ahamed | ................. | B25B 11/005 |
| 12,129,131 B2 * | 10/2024 | Watanabe | ................. | H01L 21/681 |
| 12,220,730 B2 * | 2/2025 | Li | ................. | H01L 21/68721 |
| 2008/0061519 A1 * | 3/2008 | Cho | ................. | H01L 21/68728 |
| | | | | 134/159 |
| 2009/0093123 A1 | 4/2009 | Lee et al. | | |
| 2013/0334753 A1 * | 12/2013 | Stanifer | ................. | B23Q 3/069 |
| | | | | 29/559 |
| 2017/0092532 A1 | 3/2017 | Kaba et al. | | |
| 2019/0295879 A1 * | 9/2019 | Mashimo | ................. | H01L 21/6875 |
| 2023/0420288 A1 * | 12/2023 | Hamada | ................. | H01L 21/68728 |
| 2024/0222177 A1 * | 7/2024 | Park | ................. | H01L 21/68742 |

FOREIGN PATENT DOCUMENTS

| | | |
|---|---|---|
| JP | 2008-72115 A | 3/2008 |
| JP | 2009-94514 A | 4/2009 |
| JP | 2017-69531 A | 4/2017 |
| JP | 6734666 B2 | 8/2020 |
| JP | 2021-22653 A | 2/2021 |
| KR | 10-2018-0058892 A | 6/2018 |

* cited by examiner

*Primary Examiner* — Lee D Wilson
(74) *Attorney, Agent, or Firm* — Sughrue Mion, PLLC

(57) ABSTRACT

According to one embodiment, a substrate processing apparatus includes a rotating table configured to rotate a substrate and a plurality of fixing members configured to fix the substrate on the rotating table by grasping the substrate while abutting an outer periphery of the substrate, wherein each fixing member includes a curved surface on a side that abuts the substrate, a reduced portion formed to be connected to an end of the curved surface and having a width which is continuously reduced in the first direction from a boundary with the curved surface, a first sloping surface formed on a top portion to slope downwards in the first direction, and a support portion formed on the curved surface and configured to support the substrate such that a top surface of the top portion is flush with an upper surface of the substrate in a state where the substrate is grasped.

10 Claims, 11 Drawing Sheets

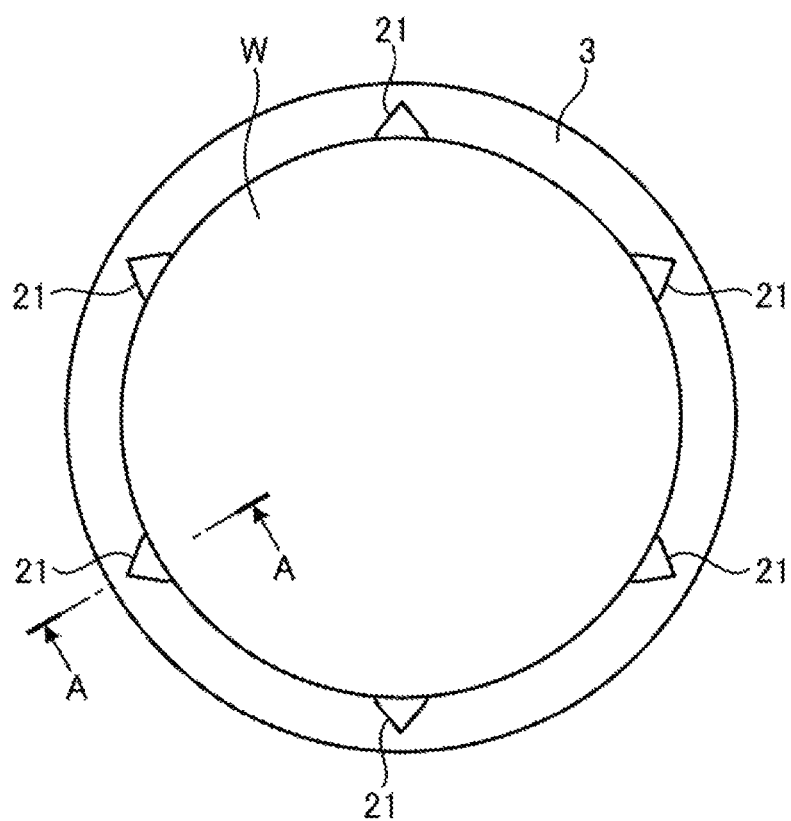

SUBSTRATE PROCESSING APPARATUS

CROSS-REFERENCE TO RELATED APPLICATION

This application is based upon and claims the benefit of priority from Japanese Patent Application No. 2022-100353, filed on Jun. 22, 2022, the entire contents of which are incorporated herein by reference.

TECHNICAL FIELD

An embodiment of the present disclosure relates to a substrate processing apparatus.

BACKGROUND

A substrate processing apparatus, which performs chemical processing or cleaning processing on substrates such as semiconductor wafers, commonly adopts a single-wafer type that processes the substrates one by one, from the viewpoint of uniformity and reproducibility of processing. The single-wafer-type substrate processing apparatus is configured to fix a substrate on a rotating table, rotate the substrate around an axis perpendicular to a substrate center as an axis of rotation, allow a processing liquid (for example, liquid chemical or pure water) to flow on the center portion of the substrate, and spread the processing liquid toward the edge of the substrate by a centrifugal force, thereby processing a substrate surface by supplying the processing liquid to the substrate surface.

Such a substrate processing apparatus includes a chuck mechanism for grasping and chucking the substrate so as to fix the substrate on the rotating table. The chuck mechanism includes a plurality of chuck pins (fixing members) disposed along a circumferential direction of the substrate in order to grasp the edge of the substrate. The chuck pins grasp the edge of the substrate at a plurality of locations along the circumferential direction of the substrate, thereby fixing the substrate on the rotating table.

SUMMARY

In the above-mentioned substrate processing apparatus, the processing liquid spread by the centrifugal force is separated from the edge of the substrate and received by an inner peripheral surface of a cup that covers the periphery of the rotating table. However, there may be a case that the processing liquid reaching the chuck pins that grasp the edge of the substrate is separated from the chuck pins, turns into mist due to a disturbance of an air current generated by the chuck pins that rotate together with the rotating table to fly upward, and then is reattached to the substrate surface. Such mist, if reattached to the substrate surface, may become a watermark, thereby causing a product defect. Therefore, it is very important to suppress reattachment of the processing liquid, which is turned into mist, for product quality improvement.

As described above, reattachment of the processing liquid that has turned into mist is generated due to the disturbance of the air current generated by the chuck pins, but it is considered that the disturbance of the air current is caused by the flow of the processing liquid along the upper surface of the substrate. Specifically, the flow of the processing liquid from the upper surface of the substrate toward the chuck pins that rotate together with the rotating table causes a generation of a gas flow (air current), and when the air current is separated from the chuck pins forms a slipstream (a state that the air current is entangled in a vortex) near the rear end of the chuck pins, the disturbance of the air current is generated.

FIG. 9 illustrates the disturbance of the air current caused by a chuck pin. Specifically, FIG. 9 schematically illustrates, from above, a chuck pin which has grasped a substrate and has rotated together with a rotating table. If the rotating table is rotated to supply a processing liquid to a substrate surface, thereby processing the substrate surface, a flow of the processing liquid is formed on the upper surface of the substrate W from the substrate W toward the chuck pin, as illustrated in FIG. 9, for example. The processing liquid flowing on the upper surface of the substrate W toward the chuck pin flows to entrain an ambient gas. That is, while the rotating table rotates, an air current heading from the substrate W toward the chuck pin is formed as illustrated in FIG. 9. Hereinafter, an origin of the flow of the processing liquid and the gas described above will be referred to as an upstream side, and an end of the flow will be referred to as a downstream side.

In addition, when the gas (air current) flowing together with the processing liquid abuts the chuck pin, the processing liquid and the air current received by the chuck pin flow along a side surface of the chuck pin, as indicated by solid arrows in FIG. 9, are separated from the chuck pin upon reaching separation positions. If a width d of a surface between the separation positions has a predetermined width, a region R2 into which no air current flows is formed on the downstream side of the rear end of the chuck pin. This region R2 reaches a negative-pressure state (a state of reduced pressure) compared with a region in which the air current flows, and the air current flows into the region R2 from the surroundings occurs, so that a vortex flow (slipstream) is formed and a disturbance of the air current is generated.

As such, while the rotating table rotates, the flow of the processing liquid generates an air current, and the air current reaches the chuck pin, thereby causing a disturbance of the air current. Due to this disturbance of the air current, the processing liquid attached to the chuck pin is separated and turned into mist, which scatters toward the upper surface of the substrate and reattaches to the substrate surface.

This phenomenon remarkably appears during a drying process for drying the upper surface of the substrate by shaking off the processing liquid (including a cleaning liquid) supplied to the upper surface of the substrate. In the drying process, the substrate, which is held on the rotating table, is rotated at a high speed of 1500 rpm (revolutions per minute) to 2000 rpm in order to shake off the processing liquid on the upper surface of the substrate. When the mist of processing liquid flying upwards from the rear end of the chuck pin by the rotation at the high speed is attached to the upper surface of the substrate with the drying process completed, a watermark is formed on the upper surface of the substrate.

To cope with such problems, a measure of reducing an amount of the processing liquid that reaches the chuck pin and minimizing the disturbance of the air current by reducing the chuck pin itself has been performed. However, there is a limitation in that the reduced chuck pin weakens the tool itself for fixing the substrate.

The present disclosure has been made to solve the above-mentioned problems, and some embodiments of the present disclosure provide a substrate processing apparatus capable of improving the substrate quality by suppressing reattachment of the processing liquid to the substrate surface.

According to one embodiment of the present disclosure, there is provided a substrate processing apparatus that includes: a rotating table configured to rotate a substrate; and a plurality of fixing members configured to fix the substrate on the rotating table by grasping the substrate while abutting an outer periphery of the substrate, wherein each of the plurality of fixing members includes: a curved surface on a side that abuts the substrate when viewed in a direction of a rotational axis of the rotating table; a reduced portion formed to be connected to an end of the curved surface when viewed in the direction of the rotational axis of the rotating table, and having a width in a direction perpendicular to a first direction facing away from the side that abuts the substrate, which is continuously reduced in the first direction from a boundary with the curved surface; a first sloping surface formed on a top portion to slope downwards in the first direction when viewed in a direction that is perpendicular to the direction of the rotational axis of the rotating table and perpendicular to the first direction; and a support portion formed on the curved surface and configured to support the substrate such that a top surface of the top portion is flush with an upper surface of the substrate in a state where the substrate is grasped.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3A is a top view illustrating a schematic configuration of a rotating table according to the first embodiment.

DETAILED DESCRIPTION

Hereinafter, embodiments of a substrate processing apparatus of the present disclosure will be described in detail with reference to the accompanying drawings. In addition, the substrate processing apparatus of the present disclosure is not limited by the following embodiments.

First Embodiment

Figure 1:
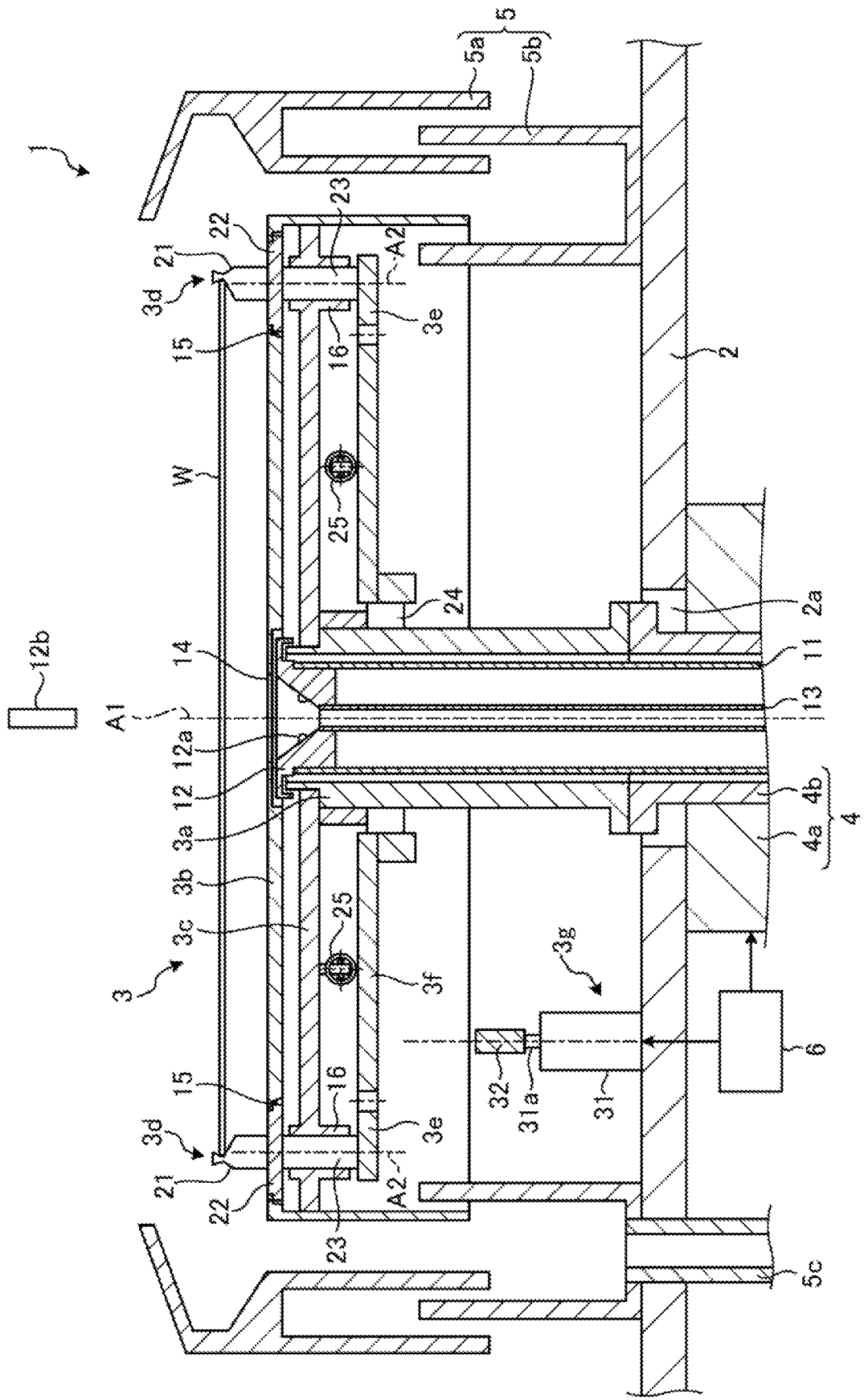
FIG. 1 is a cross-sectional view illustrating a schematic configuration of a substrate processing apparatus according to a first embodiment.

FIG. 1 is a cross-sectional view illustrating a schematic configuration of a substrate processing apparatus 1 according to a first embodiment. As illustrated in FIG. 1, the substrate processing apparatus 1 includes a base body 2 having a through-hole 2a at the center thereof, a rotating table 3 rotatably provided above the base body 2, a motor 4 serving as a driving source of the rotating table 3, an annular liquid receiver 5 surrounding the rotating table 3, and a control device 6 configured to control the motor 4.

The rotating table 3 includes a cylindrical power-transmitting body 3a configured to transfer power from the motor 4, a cover 3b configured to cover each portion, and a ring-shaped rotating plate 3c fixed to the upper end of the power-transmitting body 3a. In addition, the rotating table 3 includes a plurality of (for example, six) clamp portions 3d configured to grasp a substrate W, a plurality of (for example, six) pinion gears 3e individually provided below respective clamp portions 3d, and a master gear 3f meshing with the pinion gears 3e. In addition, a grasp release mechanism 3g fixedly disposed on the base body 2 so as to release a grasped substrate.

The motor 4 includes a tubular stator 4a and a tubular rotor 4b rotatably inserted into the stator 4a. The stator 4a is installed on the lower surface of the base body 2, and the upper end of the rotor 4b is positioned in the through-hole 2a of the base body 2. The motor 4 is an example of a driving source for rotating the rotating table 3. The motor 4 is electrically connected to the control device 6, and is driven under the control of the control device 6.

The liquid receiver (cup) 5 includes a movable liquid receiver 5a having an annular shape and configured to receive a processing liquid which has scattered or flowed downwards from a substrate W, and a fixed liquid receiver 5b having an annular shape. The liquid receiver 5 is formed to surround the rotating table 3. The movable liquid receiver 5a is configured to be movable in a vertical direction by means of an elevating mechanism (not illustrated) such as, for example, a cylinder or the like. The fixed liquid receiver 5b is fixed to the upper surface of the base body 2, and a pipe 5c is connected to the bottom surface of the fixed liquid receiver 5b so as to collect a processing liquid (for example, a liquid chemical or pure water).

The power-transmitting body 3a is fixed to the upper end of the rotor 4b of the motor 4 such that the center axis of the power-transmitting body 3a is aligned with the rotational axis of the motor 4. Therefore, the power-transmitting body 3a is rotated by driving of the motor 4. The rotational center axes of the power-transmitting body 3a and the rotational center axis of the motor 4 constitute the substrate rotational axis A1.

The power-transmitting body 3a and the rotor 4b are hollow shafts, and a holding cylinder 11, which is not rotatable, is provided in the inner space of the power-transmitting body 3a and the rotor 4b. A nozzle head 12 is provided on the upper portion of the holding cylinder 11, and a nozzle 12a is formed in the nozzle head 12 so as to eject a processing liquid (for example, a liquid chemical or pure water) toward a rear surface (lower surface in FIG. 1) of a substrate W grasped by each clamp portion 3d. A part of the processing liquid reflected at the rear surface of the substrate W is discharged to an outside through a discharge pipe 13. In addition, a nozzle 12b is provided above the rotating table 3 so as to supply the processing liquid to a front surface (upper surface in FIG. 1) of the substrate W.

The cover 3b is formed in a case shape with a lower surface opened, and is installed on the rotating plate 3c so as to rotate together with the rotating plate 3c. The cover 3b covers components that rotate together with rotation of the power-transmitting body 3a, thereby preventing occurrence of a turbulent flow. An opening 14 configured to pass the processing liquid ejected from the nozzle 12a of the nozzle head 12 to the upper portion thereof and a through-hole 15 in each clamp portion 3d are formed in the cover 3b.

The rotating plate 3c includes a plurality of support cylinder portions 16 configured to individually hold the respective clamp portions 3d. The rotating plate 3c is fixed to the outer peripheral surface of the power-transmitting body 3a to be integrated therewith, thereby rotating together with the power-transmitting body 3a. Therefore, the respective clamp portions 3d held by the rotating plate 3c also rotate together with the rotating plate 3c around the rotational center axis of the power-transmitting body 3a, that is, around the substrate rotational axis A1. In addition, respective support cylinder portions 16 are provided at an equal interval on a circle centered at the substrate rotational axis A1 at the outer periphery of the disk-shaped rotating plate 3c.

The clamp portions 3d include chuck pins (fixing members) 21 abutting the substrate W, a rotating plate 22 configured to rotate while holding the chuck pins 21, and pin rotating bodies 23 configured to rotate while holding the rotating plate 22, respectively. The chuck pins 21 are fixed onto the rotating plate 22 while being eccentric from the rotational center axis of the pin rotating bodies 23 (rotational center axis parallel to the substrate rotational axis A1), that is, from the pin rotational axis A2 by a predetermined distance. The chuck pins 21 rotate while being eccentric with respect to the pin rotational axis A2 according to the rotation of the pin rotating bodies 23. The chuck pins 21 according to the present embodiment are formed to suppress reattachment of the processing liquid to the substrate W, which will be described later in more detail.

The pin rotating bodies 23 are held by the support cylinder portions 16 of the rotating plate 3c to be rotatable. The pinion gears 3e are fixed to the lower end of the pin rotating bodies 23, which mesh with a master gear 3f having the substrate rotational axis A1 as a rotational axis. The master gear 3f is provided on bearings 24 fixed to the power-transmitting body 3a and is configured to be rotatable around the power-transmitting body 3a.

Accordingly, if the master gear 3f rotates relatively around the substrate rotational axis A1 with respect to the clamp portions 3d, the respective pinion gears 3e meshing with the master gear 3f rotate, and the pin rotating bodies 23 of the respective clamp portions 3d all rotate around the pin rotational axis A2 in a synchronized manner. If the master gear 3f rotates in the rotational direction for grasping the substrate W, the individual chuck pins 21 of the respective clamp portions 3d all rotate eccentrically in a synchronized manner, and abut the peripheral end surface (outer peripheral surface) of the substrate W, thereby grasping the substrate W such that the center of the substrate W is centered at the substrate rotational axis A1. On the other hand, if the master gear 3f rotates in a direction opposite to the rotational direction for grasping the substrate W, the individual chuck pins 21 of respective clamp portions 3d all rotate in an opposite direction in a synchronized manner, and are separated from the outer peripheral surface of the substrate W, thereby opening the substrate W that has been grasped. By operating the respective clamp portions 3d as above, the center of the substrate W is positioned (centered) at the substrate rotational axis A1 so that a chuck mechanism for grasping the substrate W can be realized.

A plurality of (for example, two) clamp springs 25 are connected between the upper side of the master gear 3f and the rotating plate 3c. The master gear 3f is pressurized by the respective clamp springs 25 in the rotational direction for grasping the substrate W. Accordingly, the respective pinion gears 3e and the respective chuck pins 21, which mesh with the master gear 3f, are evenly pressurized in the rotational direction for grasping the substrate W. In addition, one end of each clamp spring 25 engages with a spring post (not illustrated) fixed to the master gear 3f, and the other end thereof engages with a spring post (not illustrated) fixed to the rotating plate 3c. The clamp springs 25 are positioned to face each other around the substrate rotational axis A1. Spring forces of the clamp springs 25 are transferred from the master gear 3f to respective pinion gears 3e, and the respective chuck pins 21 rotate eccentrically with respect to the pin rotational axis A2 and compress the peripheral end surface of the substrate W, thereby grasping the substrate W.

As such, the master gear 3f individually rotates around the substrate rotational axis A1 with respect to the rotating plate 3c. In addition, in a state in which the substrate W is grasped by the respective chuck pins 21, the rotating plate 3c and the master gear 3f are locked with each other by the clamp springs 25 (both are integrated by the springs), and thus the master gear 3f rotates together with the rotating plate 3c. That is, the master gear 3f is configured to be individually rotatable around the substrate rotational axis A1 together with the rotating plate 3c.

The grasp release mechanism 3g includes a cylinder 31 and a stop pin 32 as illustrated in FIG. 1. The cylinder 31 includes a cylinder shaft 31a configured to move up and down. The stop pin 32 is provided at the front end of the cylinder shaft 31a. If the cylinder shaft 31a of the cylinder 31 moves upwards, the stop pin 32 at the front end of the cylinder shaft 31a moves upwards accordingly, and the master gear 3f is locked by the stop pin 32. If the rotating plate 3c rotates in a direction for opening the substrate W in a state where the master gear 3f is stationary, the respective clamp portions 3d that rotate together with the rotating plate 3c move around the master gear 3f in the same direction as the direction in which the rotating plate 3c rotates. In this case, the respective chuck pins 21 rotate eccentrically with respect to the pin rotational axis A2 in the opposite direction to the direction for grasping the substrate W, and are separated from the peripheral end surface of the substrate W. In addition, the cylinder 31 is electrically connected to the control device 6, and is driven under the control of the control device 6.

Figure 2A:
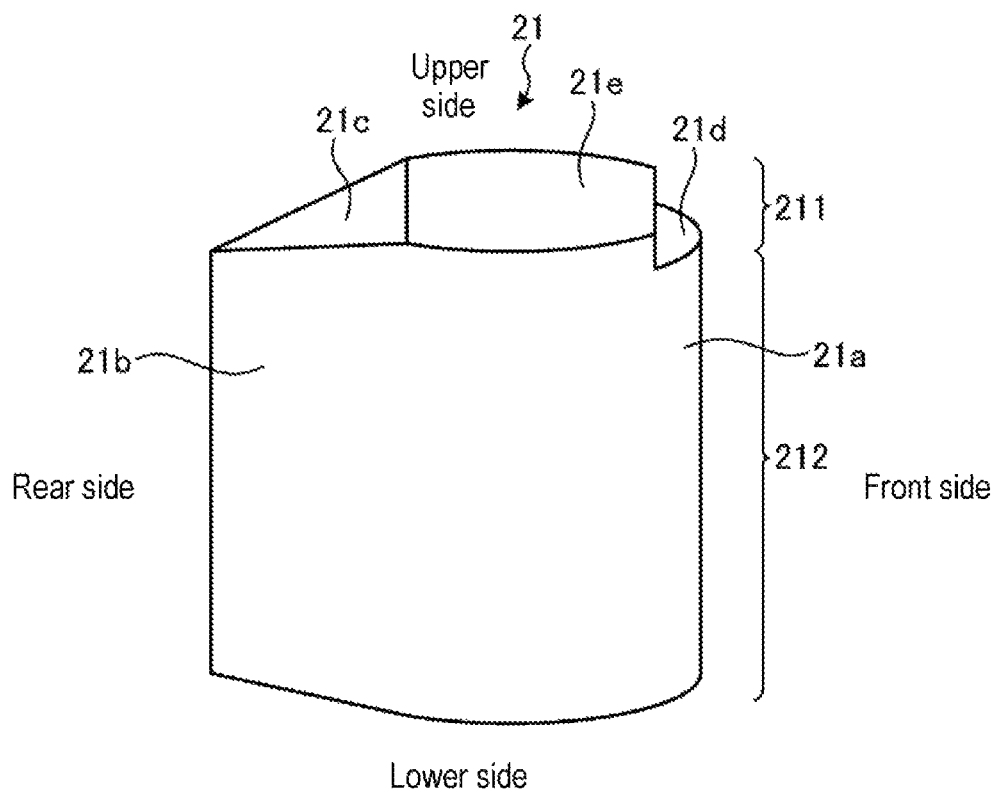
FIG. 2A is a perspective view illustrating a schematic configuration of a chuck pin according to the first embodiment.
Figure 2B:
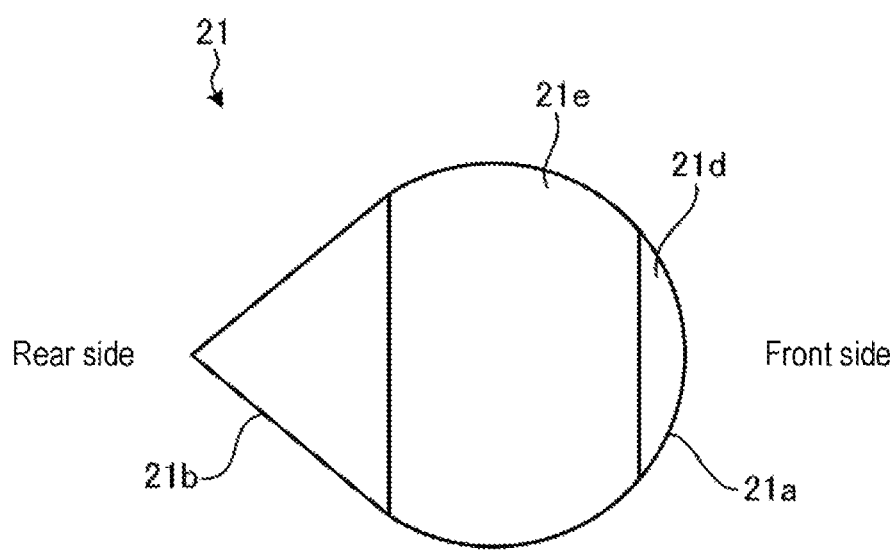
FIG. 2B is a top view illustrating a schematic configuration of a chuck pin according to the first embodiment.

Hereinafter, the chuck pin 21 according to the first embodiment will be described in detail. FIG. 2A is a perspective view illustrating a schematic configuration of the chuck pin 21 according to the first embodiment. FIG. 2B is a top view illustrating a schematic configuration of the chuck pin 21 according to the first embodiment. The upper side and lower side illustrated in FIG. 2A correspond to upper and lower directions in a state where the chuck pin 21 is supported on a rotating plate 22. In addition, the front side and rear side illustrated in FIG. 2A and FIG. 2B correspond to forward and backward directions of a case that the side abutting the substrate W refers to the front side in a state where a substrate W is grasped by the chuck pin 21. The chuck pin 21 according to the first embodiment is a fixing member configured to abut the outer periphery of a substrate W and to grasp the substrate W such that the substrate W is fixed on a rotating table 3. For example, as illustrated in FIG. 2A and FIG. 2B, the chuck pin 21 is formed in a columnar shape having a teardrop shape in a plan view, and has a top portion 211 and a base portion 212.

The top portion 211, as illustrated in FIG. 2A, corresponds to the upper portion of the chuck pin 21 in a state where the chuck pin 21 is supported on a rotating plate 22. Specifically, the top portion 211 corresponds to the upper-end portion of the chuck pin 21 provided in a state where the chuck pin 21 supports a substrate W. The base portion 212, as illustrated in FIG. 2A, corresponds to a portion below the top portion 211 in a state where the chuck pin 21 is supported on a rotating plate 22, and the rotating plate 22 is connected to the lower end of the base portion 212.

As illustrated in FIG. 2A and FIG. 2B, the chuck pin 21 has a curved surface 21a on the side that abuts the substrate W (the front side in the drawings) when viewed in the direction of the rotational axis of the rotating table 3 (in a plan view), and has a reduced portion 21b formed to be connected to an end of the curved surface 21a, when viewed in the direction of the rotational axis of the rotating table 3, such that the width of the reduced portion 21b in a direction perpendicular to a first direction facing away from the side abutting the substrate W is continuously reduced in the first direction from the boundary with the curved surface 21a. In addition, the chuck pin 21 has a first sloping surface 21c provided on the top portion 211 so as to slope downwards in the first direction when viewed in a direction that is perpendicular to the direction of the rotational axis of the rotating table 3 and perpendicular to the first direction (when viewed laterally), and has a support portion 21d formed on the curved surface 21a and configured to support a substrate W such that the top surface 21e of the top portion 211 and the upper surface of the substrate W are flush with each other in as state where the substrate W is grasped.

The chuck pin 21 is held on a rotating plate 22 such that the front side illustrated in FIG. 2A and FIG. 2B abuts a substrate W. That is, the base portion 212 of the chuck pin 21 is connected to the rotating plate 22 such that the front side in the drawings supports the substrate W. FIG. 3A is a top view illustrating a schematic configuration of the rotating table 3 according to the first embodiment. For example, the rotating table 3 holds six chuck pins 21, as illustrated in FIG. 3A. Each chuck pin 21, in each holding position, supports a substrate W by the support portion 21d formed on the front side illustrated in FIG. 2A and FIG. 2B. That is, the support portion 21d of each chuck pin 21 abuts the substrate W when the master gear 3f has rotated in the rotational direction for grasping the substrate W, and thus grasps the substrate W.

Figure 3B:
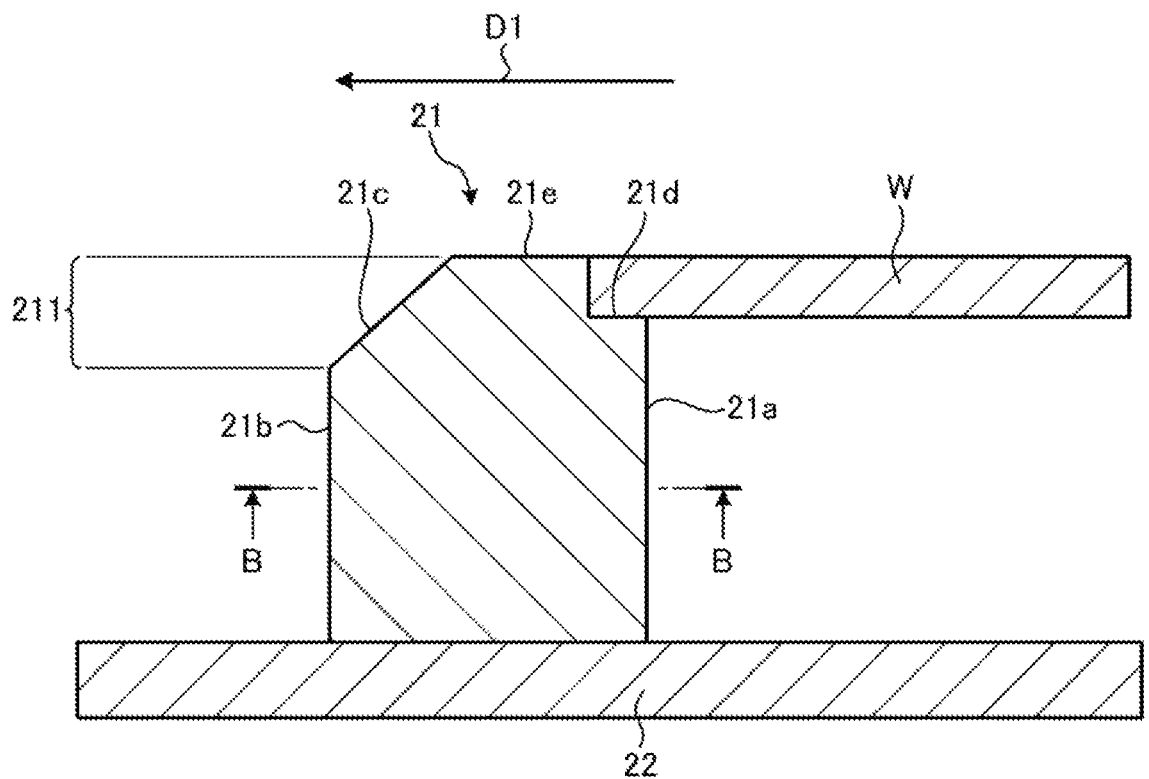
FIG. 3B is a cross-sectional view illustrating a schematic configuration of a chuck pin according to the first embodiment.

FIG. 3B is a cross-sectional view illustrating a schematic configuration of the chuck pin 21 according to the first embodiment. FIG. 3B is a cross-sectional view taken along section A-A in FIG. 3A. As illustrated in FIG. 3B, the top portion 211 of the chuck pin 21 has a top surface 21e and a first sloping surface 21c. The top surface 21e is a horizontal surface, and is formed on the side (front side) for supporting the substrate W. Specifically, the top surface 21e is formed at the front side, compared with the first sloping surface 21c. The first sloping surface 21c slopes downwards in a direction D1 (first direction) spaced apart from the side for supporting the substrate W. Specifically, the first sloping surface 21c slopes downwards in the direction D1 from an end of the top surface 21e (end of a rear side illustrated in FIG. 2A). More specifically, the first sloping surface 21c is formed on the direction D1 side of the top surface 21e so as to continuously extend downwards to the rear end of the chuck pin 21 in the direction D1. In other words, the first sloping surface 21c faces the direction D1 side so as to continuously slope in the lower side illustrated in FIG. 2A. In addition, the top portion 211 according to the first embodiment denotes the vertical portion extending from the top surface 21e to the rear end of the first sloping surface 21c as illustrated in FIG. 3B.

The first sloping surface 21c may be formed to start sloping from a middle portion in the direction D1 of the chuck pin 21 illustrated in FIG. 3B, or formed to start sloping from a rear side (D1 direction side) of the middle portion in the direction D1. For example, the first sloping surface 21c is formed to continuously extend downwards in the direction D1 from the middle portion of the chuck pin 21 (top portion 211) to the rear-side end of the chuck pin 21 toward the direction D1. Alternatively, the first sloping surface 21c is formed to continuously extend downwards in the direction D1 from a position of a rear side of the middle portion of the chuck pin 21 (top portion 211) to the rear end of the chuck pin 21 towards the direction D1. The above-mentioned examples are only examples, and the first sloping surface 21c may be formed to continuously extend downwards in the direction D1 from a position in a front side of the middle portion of the chuck pin 21 (top portion 211) to the rear end of the chuck pin 21 toward the direction D1.

The support portion 21d is provided on the top portion 211. Specifically, the support portion 21d includes a surface connected to the top surface 21e (a vertical surface connected to the top surface 21e in FIG. 3B) and a surface connected to the curved surface 21a (a horizontal surface connected to the curved surface 21a in FIG. 3B), and is formed above the curved surface 21a. That is, the support portion 21d includes a vertical surface configured to abut the outer periphery of the side surface of the substrate W, and a horizontal surface on which the outer periphery of the rear side of the substrate W is loaded. The horizontal surface of the support portion 21d is positioned below the top surface 21e by the thickness of the substrate W. In other words, the horizontal surface of the support portion 21d is positioned lower than the height of the top surface 21e by the thickness of the substrate W in a vertical direction illustrated in FIG. 2A. As the horizontal surface of the support portion 21d is formed as described above, the support portion 21d can support the substrate W such that the top surface 21e and the upper surface of the substrate W are flush with each other as illustrated in FIG. 3B. As used herein, the expression "flush with" includes a state involving a level difference to such an extent that the flow of processing liquid on the upper surface of the substrate W is not interfered with, and/or to such an extent that, even if the processing liquid flowing on the substrate abuts the chuck pin, the processing liquid is not turned into mist.

Figure 3C:
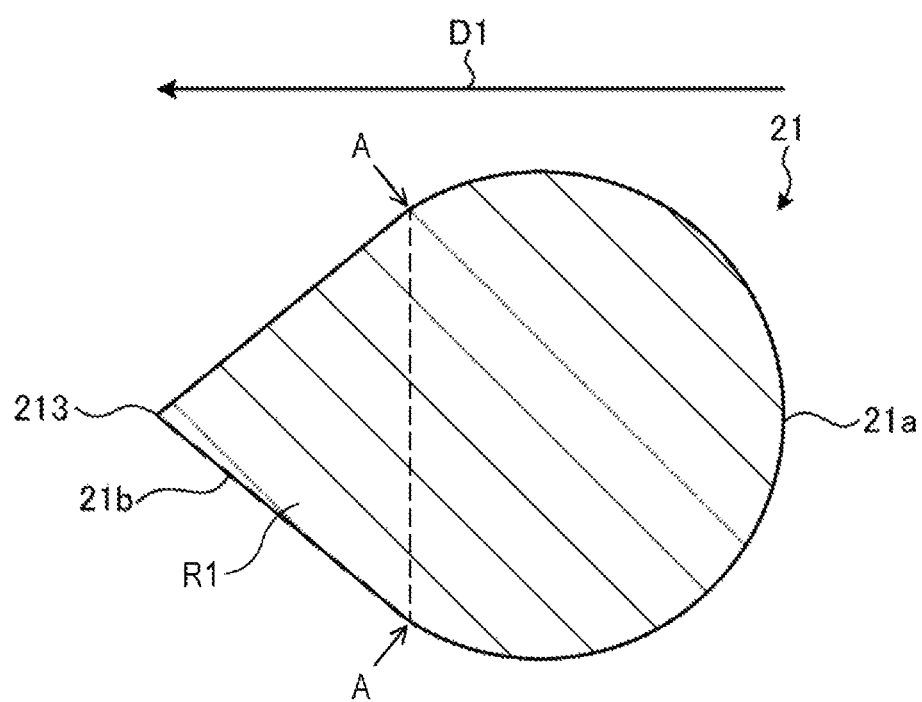
FIG. 3C is a cross-sectional view illustrating a schematic configuration of a chuck pin according to the first embodiment.

FIG. 3C is a cross-sectional view illustrating a schematic configuration of the chuck pin 21 according to the first embodiment. FIG. 3C is a cross-sectional view taken along section B-B in FIG. 3B. That is, the cross-sectional view in FIG. 3C is a plan view of a horizontal section of the chuck pin 21 not including the support portion 21d. As illustrated in FIG. 3C, the curved surface 21a of the chuck pin 21 appears as a curved line on the horizontal section. That is, the curved surface 21a is formed by continuing the horizontal curved line in the vertical direction. The curved surface 21a is formed below the support portion 21d on the front side (the side for supporting a substrate W) of the chuck pin 21 as illustrated in FIG. 3B. That is, the curved surface 21a is formed below the support portion 21d on the side surface of the front side of the chuck pin 21.

In addition, as illustrated in FIG. 3C, the chuck pin 21 includes a reduced portion 21b whose width in a direction perpendicular to the direction D1 is continuously reduced toward the direction D1. The reduced portion 21b refers to a region R1 surrounded by the rear-side end 213 of the chuck pin 21, from a position in which the width in the direction perpendicular to the direction D1 starts to be reduced (end point A of the curved surface 21a). For example, as illustrated in FIG. 3C, the chuck pin 21 has a reduced portion 21b that is a region where side surfaces become closer to each other in a direction facing away from an end of the curved surface 21a (end portion of the curved surface 21a) and are joined at the rear-side end 213 of the chuck pin 21.

As such, the chuck pin 21 according to the first embodiment has a horizontal section which includes a curved surface 21a and a reduced portion 21b, and which is formed in a teardrop shape, for example.

The substrate processing apparatus 1 according to the first embodiment includes a chuck pin 21 configured as described above such that reattachment of the processing liquid to the substrate W is suppressed, thereby improving the substrate quality. Specifically, since the reduced portion 21b and the first sloping surface 21c is formed in the chuck pin 21, the chuck pin 21 is shaped to be reduced in a scattering direction of the processing liquid, and it is possible to decrease the occurrence of the disturbance of the air current at the rear side of the chuck pin 21 can be decreased. Specifically, by forming the chuck pin 21 having a shape to be reduced in the scattering direction of the processing liquid, the width (surface) of the rear-side end 213 of the chuck pin 21 becomes small, so that it is possible to make a region in which a negative pressure occurs downstream of the rear-side end 213 of the chuck pin 21, small. That is, in the chuck pin 21, a region in which a vortex gas flow is formed by introducing a gas flow from surroundings becomes small, which results in suppressing the occurrence of a disturbance (vortex). As a result, the chuck pin 21 can prevent the processing liquid, which is separated from the chuck pin 21, from scattering (flying upwards). That is, the chuck pin 21 can reduce the mist of processing liquid scattered toward the substrate W, and can suppress reattachment of the processing liquid to the substrate W, thereby improving the substrate quality. A substrate W processed by such a substrate processing apparatus 1 has a sufficiently high quality to be used to the edge limit.

In addition, the chuck pin 21 having the above-described configuration guarantees smooth discharge of the processing liquid toward the liquid receiver (cup) 5 such that the processing liquid is preventing from being turned into mist, thereby suppressing reattachment of the processing liquid to the substrate W. For example, the chuck pin 21 has a first sloping surface 21c formed thereon such that the processing liquid separated from the chuck pin 21 can be discharged downwards. That is, the chuck pin 21 can discharge the processing liquid such that the separated processing liquid is directed toward the inner surface of the liquid receiver (cup) 5.

In addition, for example, the chuck pin 21 has a curved surface 21a formed on the front side and has a reduced portion 21b formed on the rear side so that the processing liquid that has reached the chuck pin 21 from the upper or lower surface of the substrate W can be quickly discharged to the liquid receiver (cup) 5. That is, the curved surface 21a and the reduced portion 21b of the chuck pin 21 guarantee that the processing liquid attached to the chuck pin 21 is quickly discharged to the liquid receiver (cup) 5 without scattering to the upper surface of the substrate W.

In addition, for example, the chuck pin 21 is formed such that a top surface 21e is flush with the upper surface of the substrate W in a state where the substrate W remains held, so that the processing liquid that has flowed along the upper surface of the substrate W is prevented from being scattered by a collision with the top portion 211 of the chuck pin 21. That is, the chuck pin 21 does not interfere with the flow of the processing liquid along the upper surface of the substrate W, thereby facilitating the discharge of the processing liquid.

Figure 4A:
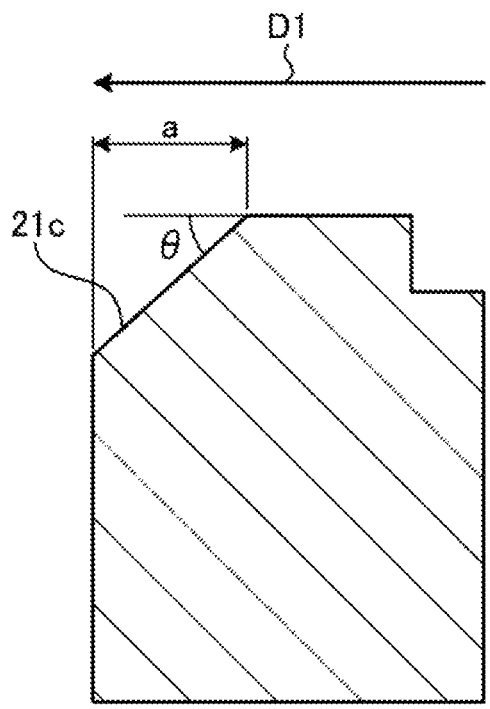
FIG. 4A illustrates a dimension of a first sloping surface according to the first embodiment.
Figure 4B:
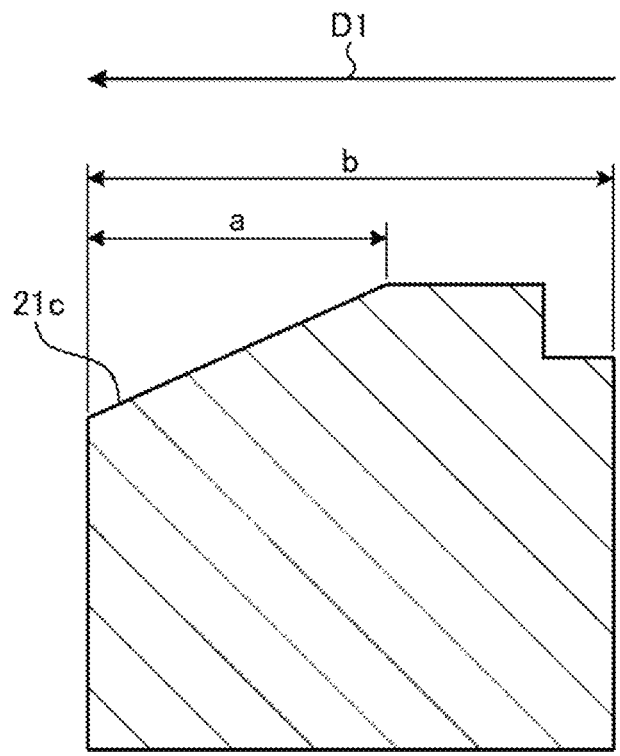
FIG. 4B illustrates a dimension of a first sloping surface according to the first embodiment.

Thereafter, a dimension of the first sloping surface 21c will be described with reference to FIG. 4A and FIG. 4B. FIG. 4A and FIG. 4B illustrate the dimension of the first sloping surface 21c according to the first embodiment. FIG. 4A and FIG. 4B are cross-sectional views taken along section A-A in FIG. 3A. For example, the first sloping surface 21c is formed such that a length "a" of the first sloping surface 21c in the direction D1 illustrated in FIG. 4A is 1 mm. In addition, for example, the first sloping surface 21c may be formed such that an angle of inclination θ of the first sloping surface 21c illustrated in FIG. 4A (angle of a case where the upper surface corresponds to 0 degree) is in the range of 5 degrees to 80 degrees.

The length "a" of the first sloping surface 21c of the chuck pin 21 in the direction D1 may correspond to at least half of the length of the entire chuck pin 21 (top portion 211) in the direction D1, thereby suppressing the disturbance of the air current. Specifically, as illustrated in FIG. 4B, the length "a" of the first sloping surface 21c in the direction D1 corresponds to at least half of the length "b" of the length of the entire chuck pin 21 (top portion 211) in the direction D1 illustrated in FIG. 4B. In other words, the angle of inclination of the first sloping surface 21c becomes gentle by increasing the length "a" without changing the height of the rear-side end of the first sloping surface 21c. For example, the first sloping surface 21c may be formed such that the length "a" is in the range of 1 mm to 50 mm.

For example, if the angle of inclination of the first sloping surface 21c is too large, a small amount of processing liquid flows along the sloping surface together with the processing liquid, thereby increasing the possibility of the occurrence of negative pressure. That is, a lower pressure is generated on the first sloping surface 21c than the surroundings of the sloping surface. Such a state introduces a gas flow onto the first sloping surface 21c from the surroundings, thereby forming the disturbance of the air current (vortex) on the first sloping surface 21c. As a result, mist of the processing liquid separated from the first sloping surface 21c scatters toward the upper surface of the substrate W due to the disturbance of the air current.

Therefore, the angle of inclination of the first sloping surface 21c is made gentle as described above so as to make a gas flow along the first sloping surface 21c together with the processing liquid and to reduce the region in which a negative pressure is generated on the first sloping surface 21c, thereby suppressing the occurrence of the disturbance of the air current. As a result, mist of the processing liquid separated from the first sloping surface 21c can be prevented from scattering to the upper surface of the substrate W.

In addition, the length "a" of the first sloping surface 21c in the direction D1 and the angle of inclination θ of the first sloping surface 21c have optimal numeral values determined by experiments or simulations.

Figure 5A:
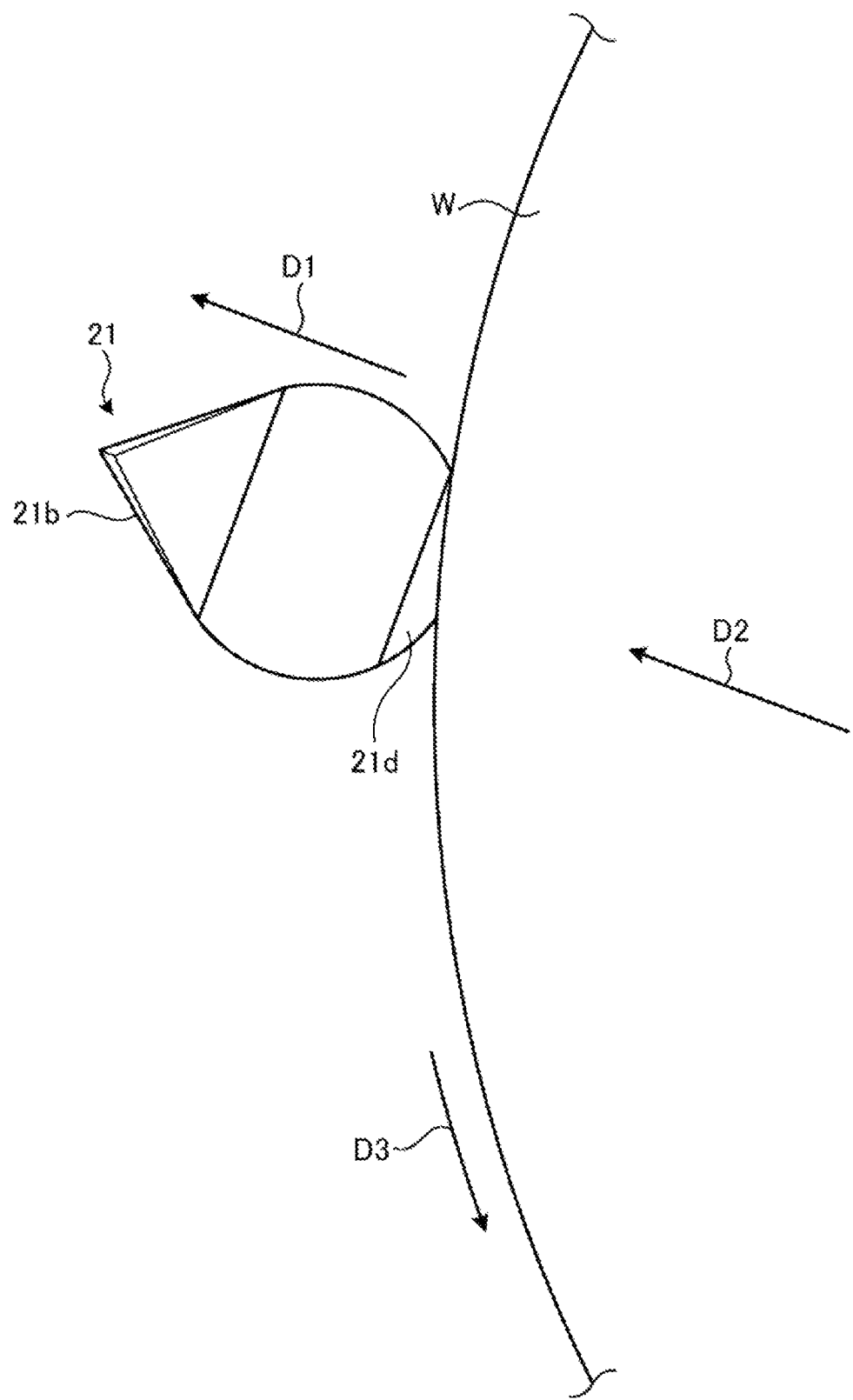
FIG. 5A illustrates a chuck pin installation direction according to the first embodiment.
Figure 5B:
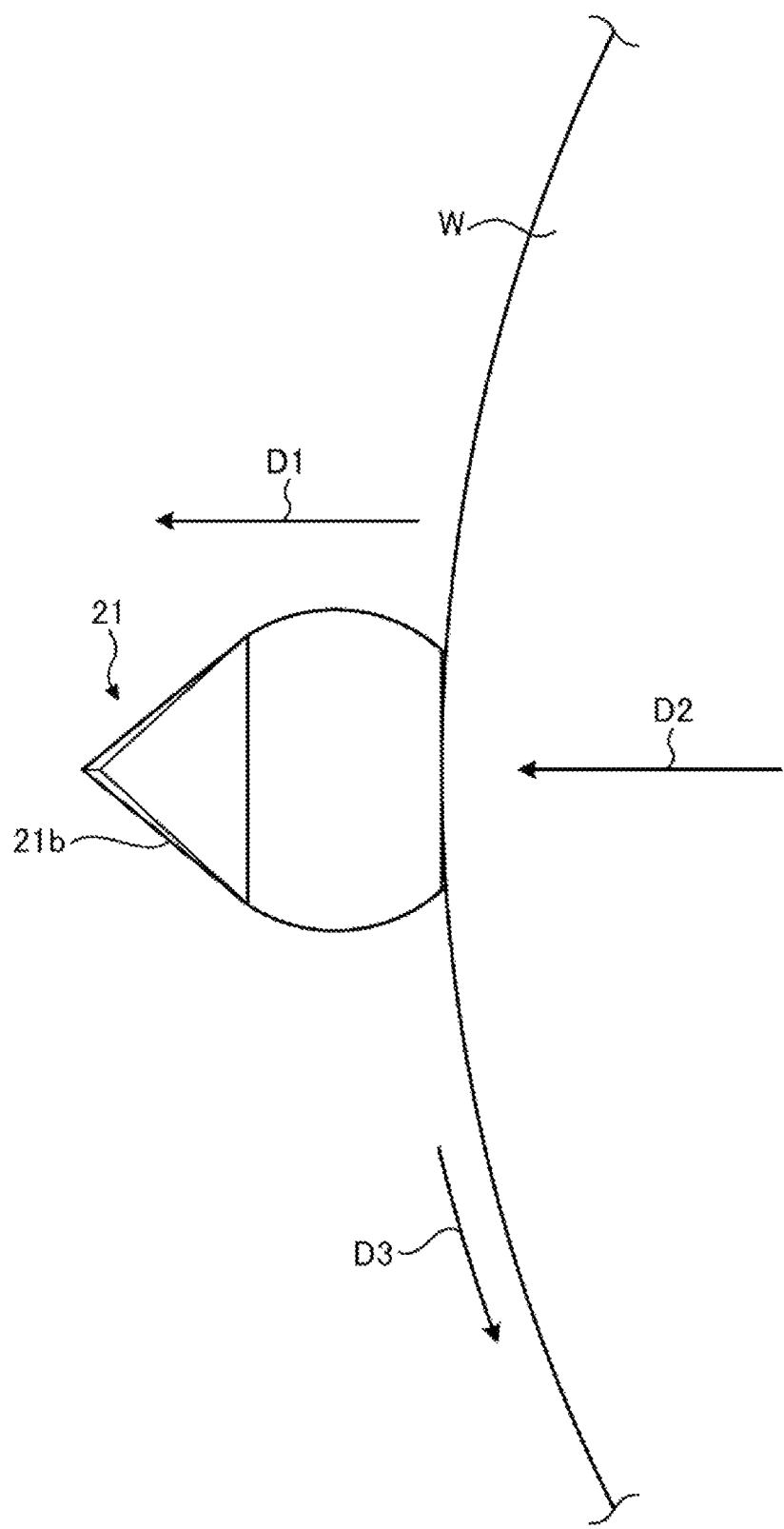
FIG. 5B illustrates a chuck pin installation direction according to the first embodiment.

The direction of installation of the chuck pin 21 will now be described. The chuck pin 21 may be provided such that the direction D1 (a direction in which a width is continuously reduced in the reduced portion 21b) is parallel to the scattering direction of the processing liquid supplied to the substrate W. FIG. 5A and FIG. 5B illustrate a direction of installation of the chuck pin 21 according to the first embodiment. FIG. 5A and FIG. 5B are top views of the chuck pin 21 in a state where the substrate W is held. That is, FIG. 5A and FIG. 5B illustrate a state in which the support portion 21d has abutted the substrate W by rotating the master gear 3f in the rotation direction for grasping the substrate W.

As illustrated in FIG. 5A, for example, a processing liquid is supplied by rotating the substrate W in the direction D3 (counterclockwise (CCW) direction) while being grasped by the chuck pin 21. For example, if the substrate W is rotated at 500 revolutions per minute (rpm), the direction in which the processing liquid flowing along the upper surface of the substrate W scatters becomes the direction D2 illustrated in FIG. 5A. In case of a substrate processing apparatus 1 configured to process a substrate W at such rpm, the chuck pin 21 is held on the rotating plate 22 such that the direction D1 becomes the direction illustrated in FIG. 5A in a state where the support portion 21d abuts the substrate W.

In addition, if the substrate W is rotated at 1000 rpm, for example, the direction in which the processing liquid flowing along the upper surface of the substrate W scatters becomes the direction D2 illustrated in FIG. 5B. In case of a substrate processing apparatus 1 configured to process a substrate W at such rpm, the chuck pin 21 is held on the rotating plate 22 such that the direction D1 becomes the direction illustrated in FIG. 5B in a state where the support portion 21d abuts the substrate W.

In addition, the example in FIG. 5A and FIG. 5B is only an example, and the direction D1 is not necessarily parallel to the direction D2. As described above, a phenomenon that mist of the processing liquid flying upwards by the disturbance of the air current is reattached to the substrate surface remarkably appears during a drying process in which the rotating table 3 is rotated at a high speed of 1500 rpm to 2000 rpm. Therefore, the direction of installation of the chuck pin 21 may be determined in view of the number of rotations during the drying process. That is, in connection with the number of rotations during the drying process, the chuck pin 21 may be configured such that the direction D1 (the direction in which the width is continuously reduced in the reduced portion 21b) is parallel to the scattering direction of the processing liquid, and the direction D1 may not be parallel to the scattering direction of the processing liquid scatters in other processes.

In addition, if the substrate processing apparatus 1 has a mechanism capable of changing the direction of the chuck pin 21 in a state where a substrate W is held, the direction of the chuck pin 21 may be changed according to the number of rotations of each process.

As described above, the chuck pin 21 is held such that the direction D1 (the direction in which the width is continuously reduced in the reduced portion 21b) is parallel to the scattering direction D2 of the processing liquid supplied to the substrate W, thereby ensuring that the processing liquid separated from the substrate W is discharged smoothly along the side surface of the chuck pin 21. That is, the flow of the processing liquid is not interfered with, thereby preventing the processing liquid from scattering, and thus suppressing the occurrence of mist.

(Modification 1)

Figure 6A:
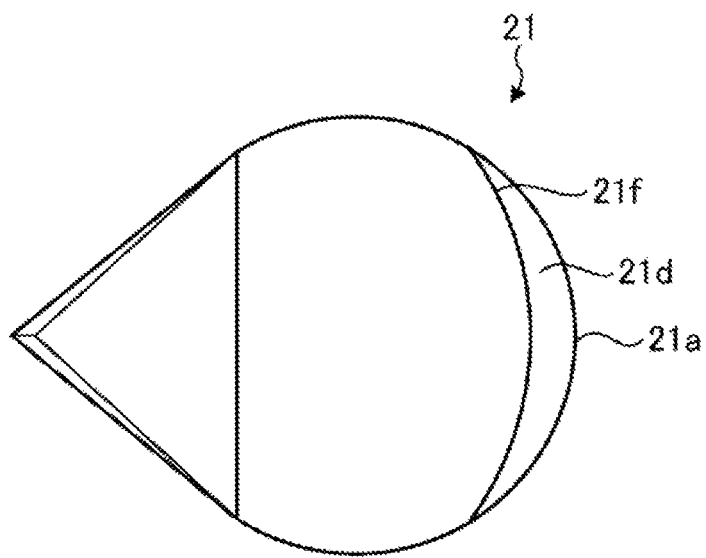
FIG. 6A is a top view illustrating a schematic configuration of a chuck pin according to modification 1.

The support portion 21d of the chuck pin 21 is not limited to the above-described shape, and may be formed in various shapes. FIG. 6A is a top view illustrating a schematic configuration of a chuck pin 21 according to modification 1. For example, a longitudinal surface (vertical surface) of the support portion 21d, which is connected to the top surface 21e, may be formed as a curved surface 21f as illustrated in FIG. 6A. That is, a surface that abuts an outer peripheral surface of a substrate W may be formed as a curved surface 21f. In addition, a transverse surface of the support portion 21d, which is connected to the curved surface 21a, may be formed as a curved surface.

Figure 6B:
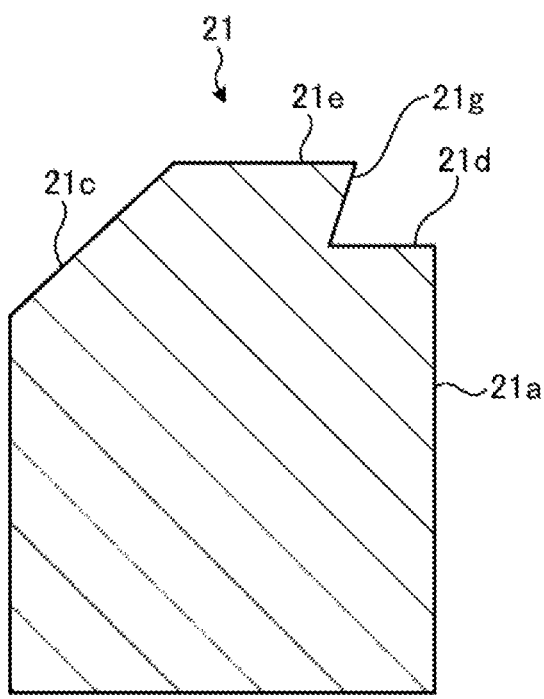
FIG. 6B is a cross-sectional view illustrating a schematic configuration of a chuck pin according to modification 1.

FIG. 6B is a cross-sectional view illustrating a schematic configuration of the chuck pin 21 according to modification 1. FIG. 6B is a cross-sectional view taken along section A-A of FIG. 3A described above. For example, the support portion 21d may have a longitudinal surface formed as a sloping surface 21g such that, as illustrated in FIG. 6B, the longitudinal surface connected to the top surface 21e, and the transverse surface (horizontal surface) connected to the curved surface 21a have an acute angle therebetween. That is, the surface that abuts an outer peripheral surface of a substrate W may be formed as a sloping surface 21g. In addition, the support portion 21d may have a transverse surface formed as a sloping surface.

(Modification 2)

Figure 7A:
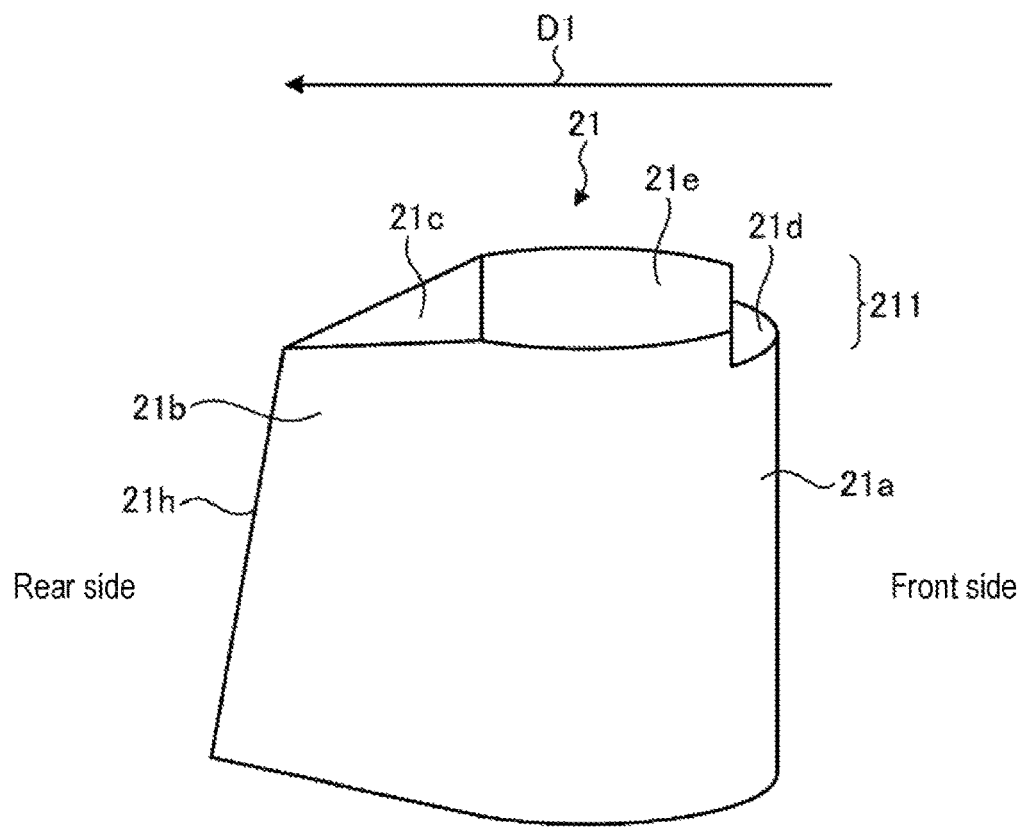
FIG. 7A is a perspective view illustrating a schematic configuration of a chuck pin according to modification 2.

The shape of the rear side of the chuck pin 21 is not limited to the shape described in the first embodiment, and may be formed in various shapes. FIG. 7A is a perspective view illustrating a schematic configuration of a chuck pin 21 according to modification 2. For example, as illustrated in FIG. 7A, the chuck pin 21 may additionally have a second sloping surface 21h which slopes downwards from an end of the first sloping surface 21c in the first direction when viewed in a direction that is perpendicular to the direction of the rotational axis of the rotating table 3 and perpendicular to the first direction. The second sloping surface 21h, which is additionally provided on the rear side of the chuck pin 21, may result in a gentle change in a flow of the gas that flows together with the processing liquid from the first sloping surface 21c to the second sloping surface 21h, thereby further suppressing the disturbance of the air current.

Since the gas flow separated from the rear end of the first sloping surface 21c flows along an extension line of the first sloping surface 21c, for example, if the second sloping surface 21h is provided perpendicularly to the top surface 21e, a flow, which descends from the upper portion of the second sloping surface 21h (near the connection portion with the first sloping surface 21c) along the second sloping surface 21h becomes small. That is, a lower pressure is generated on the upper portion of the second sloping surface 21h than the surrounding pressure, thereby forming a negative-pressure region. When the negative-pressure region is formed in this manner, a gas flow is introduced to the upper portion of the second sloping surface 21h from surroundings and a disturbance of an air current is formed. As a result, mist of the processing liquid separated from the chuck pin 21 (processing liquid flowing along the sloping surface of the chuck pin) scatters toward the substrate W due to the disturbance of the air current.

Therefore, by making an angle of inclination of the second sloping surface 21h large so as to allow the gas flow that flows along the first sloping surface 21c together with the processing liquid to flow by means of the second sloping surface 21h as well, formation of a negative-pressure region on the upper portion of the second sloping surface 21h is suppressed. This suppresses occurrence of a disturbance of an air current, so that mist of the processing liquid separated from the chuck pin 21 is suppressed from being scattered toward the substrate W.

Figure 7B:
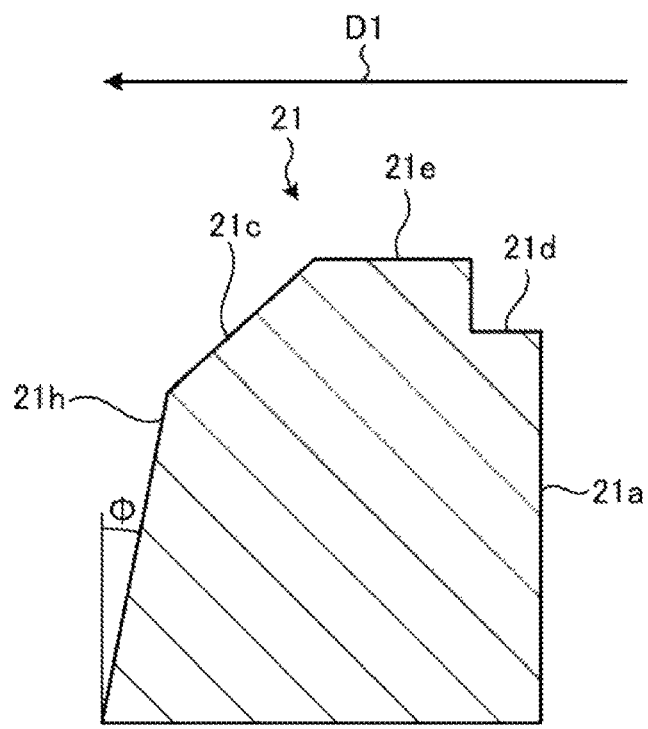
FIG. 7B illustrates a dimension of a second sloping surface according to modification 2.

FIG. 7B illustrates the dimension of the second sloping surface 21h according to modification 2. FIG. 7B is a cross-sectional view taken along section A-A described above. For example, the second sloping surface 21h may be formed such that the angle of inclination φ illustrated in FIG. 7B (angle assuming that the vertical direction corresponds to 0 degree) is in the range of 1 to 80 degrees. The angle of inclination φ of the second sloping surface 21h has an optical numeral value determined by experiments or simulations. In addition, the second sloping surface 21h also includes a ridge (boundary line of the side surfaces) formed by joining of side surfaces of the reduced portion 21b, which become closer to each other in a direction facing away from an end of the curved surface 21a (end point of the curved surface 21a).

As described above, according to the first embodiment, the substrate processing apparatus 1 includes a rotating table 3 configured to rotate a substrate W, and a plurality of chuck pins 21 configured to abut the outer periphery of the substrate W and to grasp the substrate W such that the substrate W is fixed on the rotating table 3. Each chuck pin 21 has a curved surface 21a on a side that abuts the substrate W when viewed in the direction of the rotational axis of the rotating table 3, and a reduced portion 21b, which is formed to be connected to an end of the curved surface 21a when viewed in the direction of the rotational axis of the rotating table 3, and has a width in a direction perpendicular to a first direction (direction D1) facing away from the side that abuts the substrate W, which is continuously reduced from a boundary with the curved surface 21a along the first direction. In addition, each chuck pin 21 has a first sloping surface 21c formed on the top portion 211 so as to slope downward in the first direction when viewed in a direction that is perpendicular to the direction of the rotational axis of the rotating table 3 and perpendicular to the first direction, and has a support portion 21d formed on the curved surface 21a such that, when the substrate W is grasped, the top surface 21e of the top portion 211 is flush with the upper surface of the substrate W. Therefore, the substrate processing apparatus 1 according to the first embodiment can reduce the disturbance of the air current occurring at the rear side (downstream side) of the chuck pin 21, and can prevent mist of the processing liquid separated from each chuck pin 21 from being scattered toward the substrate W after flying upward by the disturbance of air current. As a result, the substrate processing apparatus 1 can suppress reattachment of the processing liquid to the substrate W, so that it is possible to improve the substrate quality.

In addition, according to the first embodiment, a support portion 21d is provided on the top portion 211. Therefore, the substrate processing apparatus 1 according to the first embodiment can be held such that the top surface 21e of the top portion 211 is flush with the upper surface of the substrate W by the support portion 12d.

In addition, according to the first embodiment, when viewed in a direction that is perpendicular to the direction of the rotational axis of the rotating table 3 and perpendicular to the first direction, the top portion 211 has a horizontal surface (top surface 21e) on the side (front side) that supports the substrate W, and the first sloping surface 21c slopes downwards from an end of the horizontal surface in the first direction (direction D1). In addition, according to the first embodiment, the length of the first sloping surface 21c in the first direction (direction D1) is at least half of the length of the entire chuck pin 21 (top portion 211) in the first direction. Therefore, the substrate processing apparatus 1 according to the first embodiment can allow a gas flow flowing together with processing liquid to flow along the first sloping surface 21c by having a gentle angle of inclination of the first sloping surface 21c, and makes formation of a negative-pressure region on the first sloping surface 21c difficult. As a result, the substrate processing apparatus 1 can suppress the occurrence of the disturbance of the air current, thereby preventing mist of the processing liquid from flying upwards toward the substrate W.

In addition, according to the first embodiment, the chuck pin 21 is provided such that the direction of the reduced portion 21b of which the width is continuously reduced in the first direction (direction D1) is parallel to the direction (direction D2) in which the processing liquid supplied to the substrate scatters. Therefore, the substrate processing apparatus 1 according to the first embodiment can avoid interference with the flow of processing liquid and can prevent the processing liquid from being thrown upwards, thereby suppressing the generation of mist of the processing liquid.

In addition, according to the first embodiment, the chuck pin 21 additionally has a second sloping surface 21h which slopes downwards from an end of the first sloping surface 21c in the first direction (direction D1) when viewed in a direction that is perpendicular to the direction of the rotational axis of the rotating table 3 and perpendicular to the first direction. Therefore, the substrate processing apparatus 1 according to the first embodiment makes a change in flow of the gas that flows together with the processing liquid from the first sloping surface 21c to the second sloping surface 21h gentle, thereby further suppressing the disturbance of the air current. That is, the substrate processing apparatus 1 has the second sloping surface 21h provided such that the gas flow that flows along the first sloping surface 21c together with the processing liquid is made to flow by means of the second sloping surface 21h as well, thereby suppressing formation of a negative-pressure region on the upper portion of the second sloping surface 21h. As a result, the substrate processing apparatus 1 can suppress the occurrence of the disturbance of the air current, thereby preventing mist of the processing liquid separated from the chuck pin 21 from scattering toward the substrate W. In addition, in the substrate processing apparatus 1, since the disturbance of the air current generated at the rear side (downstream side) of the chuck pin 21 is suppressed, mist of the processing liquid separated from each chuck pin 21 does not scatter toward the substrate W, and is discharged to the inner surface of the liquid receiver 5 (*cup*).

Second Embodiment

The first embodiment has been described above with regard to case in which a curved surface 21a, a reduced portion 21b, a first sloping surface 21c, and a support portion 21d are formed on the entire chuck pin. The second embodiment will be described with regard to a case in which a curved surface 21a, a reduced portion 21b, a first sloping surface 21c, and a support portion 21d are formed on a part of the chuck pin. In addition, the substrate processing apparatus 1 according to the second embodiment differs from that according to the first embodiment only in terms of the chuck pin. That is, the substrate processing apparatus 1 according to the second embodiment has the same configuration as illustrated in FIG. 1 except that the chuck pin 21 is replaced with a chuck pin 100 described below.

Figure 8A:
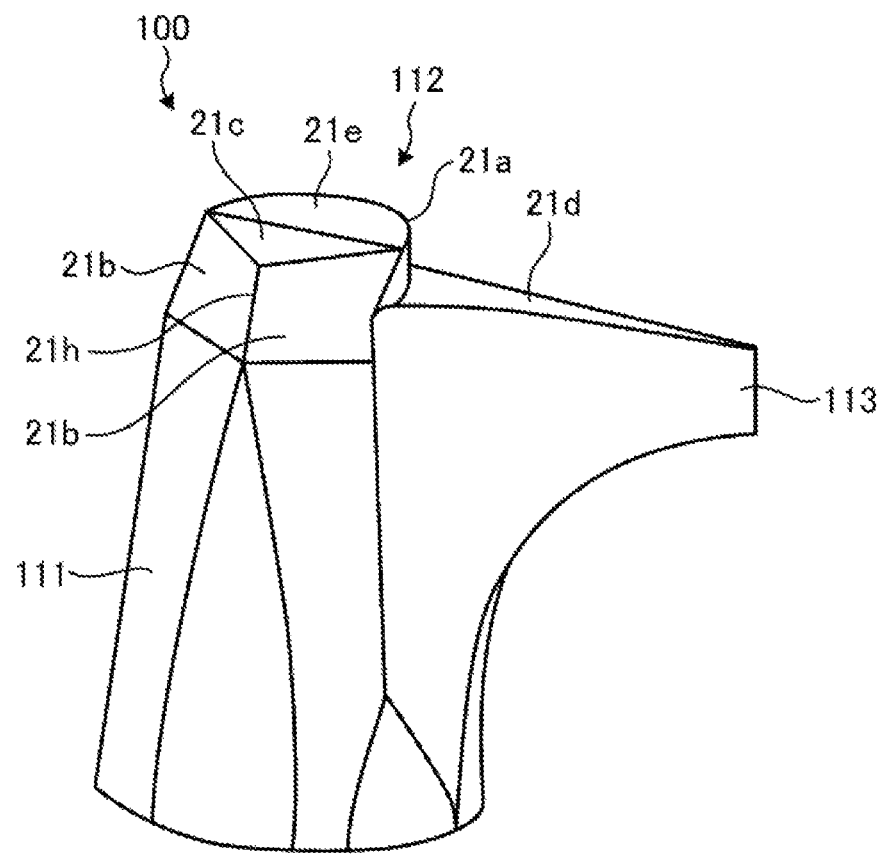
FIG. 8A is a perspective view illustrating a schematic configuration of a chuck pin according to a second embodiment.
Figure 8B:
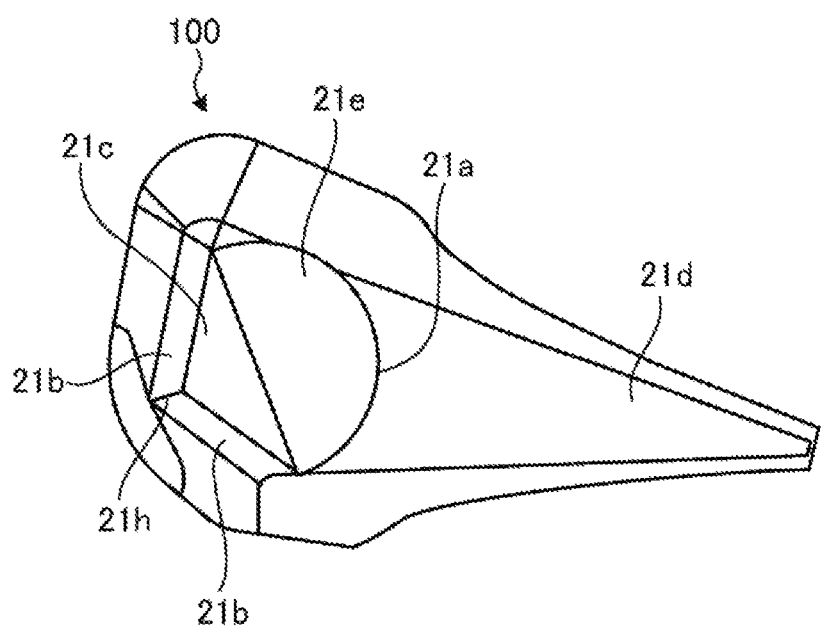
FIG. 8B is a top view illustrating a schematic configuration of a chuck pin according to the second embodiment.
Figure 9:
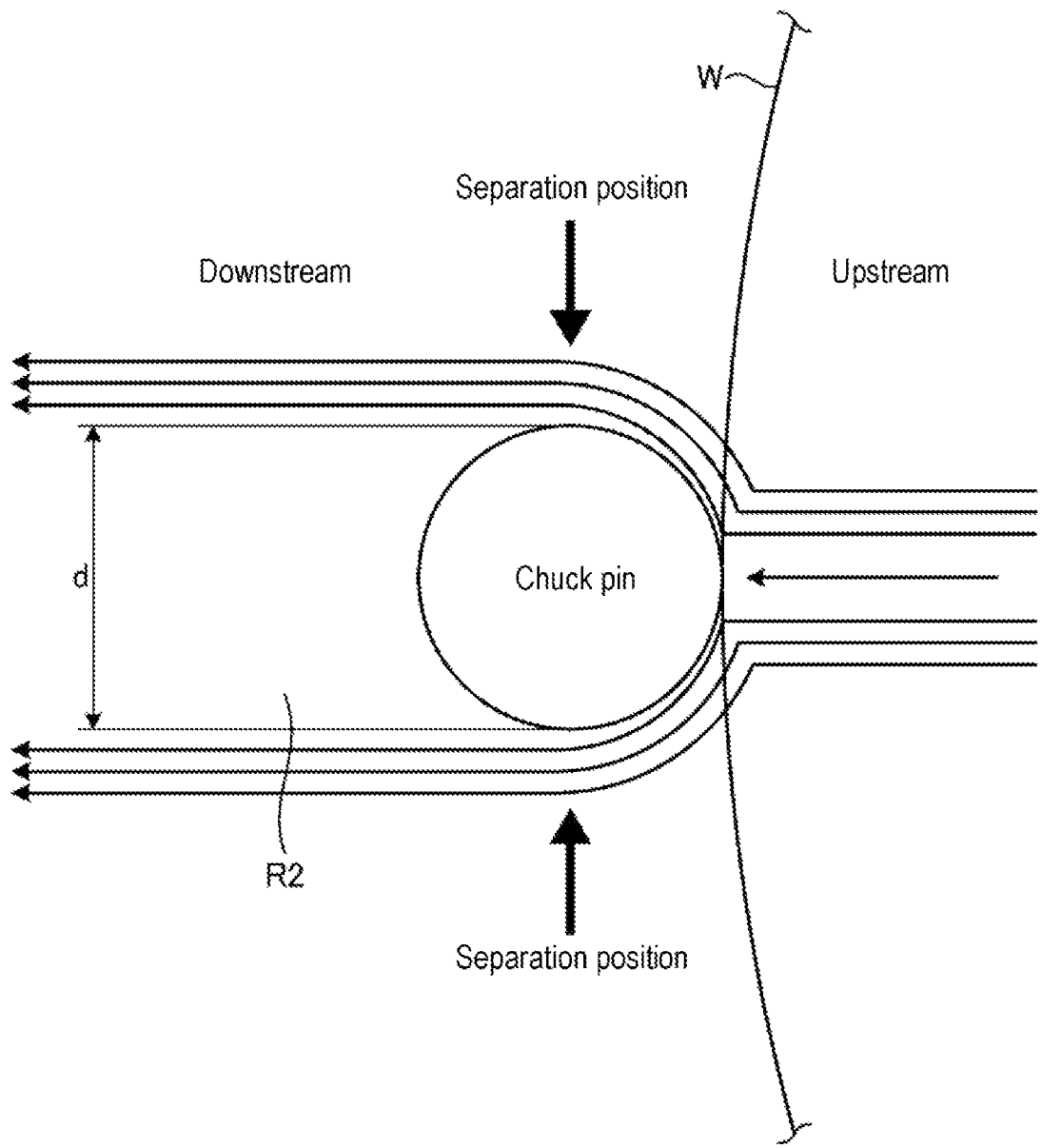
FIG. 9 illustrates a gas flow disturbance caused by a chuck pin.

FIG. 8A is a perspective view illustrating a schematic configuration of a chuck pin 100 according to the second embodiment. FIG. 8B is a top view illustrating a schematic configuration of a chuck pin 100 according to the second embodiment. As illustrated in FIG. 8A, the chuck pin 100 according to the second embodiment has a base portion 111, a top portion 112, and a protrusion portion 113 configured to support a substrate W.

The base portion 111 is connected to the top portion 112 and the protrusion portion 113, and is held by a rotating plate 22. The top portion 112 has a curved surface 21a, a reduced portion 21b, a first sloping surface 21c, a top surface 21e, and a second sloping surface 21h formed thereon, as illustrated in FIG. 8A. Specifically, as illustrated in FIG. 8B, the top portion 112 has a curved surface 21a on a side that abuts the substrate W when viewed in the direction of the rotational axis of the rotating table 3 (when viewed from above), has a reduced portion 21b formed to be connected to an end of the curved surface 21a when viewed in the direction of the rotational axis of the rotating table 3 (when viewed from above), such that the width of the reduced portion 21b in a direction perpendicular to a first direction (away from the side abutting the substrate W) is continuously reduced in the first direction from the boundary with the curved surface 21a, and has a first sloping surface 21c provided to slope downwards in the first direction when viewed in a direction that is perpendicular to the direction of the rotational axis of the rotating table 3 and perpendicular to the first direction (when viewed laterally). In addition, the top portion 112 has a second sloping surface 21h provided to slope downwards from an end of the first sloping surface 21c in the first direction when viewed in a direction that is perpendicular to the direction of the rotational axis of the rotating table 3 and perpendicular to the first direction (when viewed laterally).

The curved surface 21a, the reduced portion 21b, the first sloping surface 21c, and the top surface 21e according to the second embodiment are formed identically as respective components according to the first embodiment. In addition, the length of the first sloping surface 21c in the first direction according to the second embodiment is determined by a comparison with the length of the top portion 112 in the first direction. For example, the length of the first sloping surface 21c in the first direction according to the second embodiment is formed to be at least half of the length of the top portion 112 in the first direction.

The support portion 21d according to the second embodiment is configured by a taper surface of the protrusion portion 113, and the curved surface 21a. That is, the chuck pin 100 supports a substrate W by means of the taper surface of the protrusion portion 113, and if the master gear 3f has rotated in the rotational direction for grasping the substrate W, the curved surface 21a abuts the substrate W, thereby grasping the substrate W. The part of the taper surface of the protrusion portion 113, which abuts the longitudinal surface (vertical surface) connected to the top surface 21e, is formed below the top surface 21e of the top portion 112 by the thickness of the substrate W. In other words, the part of the taper surface of the protrusion portion 113, which abuts the longitudinal surface (vertical surface) connected to the top surface 21e, is positioned lower than the height of the top surface 21e by the thickness of the substrate W. Accordingly, the support portion 21d can support the substrate W such that the top surface 21e is flush with the upper surface of the substrate W. In addition, the taper surface of the protrusion portion 113 slopes downwards toward the substrate W from the part that abuts the longitudinal surface (vertical surface) connected to the top surface 21e. That is, the taper surface of the protrusion portion 113 slopes downwards from the top portion 112 toward the front end of the protrusion portion 113.

The shapes of the base portion 111 and the protrusion portion 113 illustrated in FIG. 8A are only examples, and they may be formed in various other shapes. For example, the base portion 111 may be formed in a cylindrical shape.

As described above, according to the second embodiment, the substrate processing apparatus 1 includes a rotating table 3 configured to rotate a substrate W, and a plurality of chuck pins 100 configured to abut the outer periphery of the substrate W and to grasp the substrate W such that the substrate W is fixed on the rotating table 3. Each chuck pin 100 has a top portion 112, a base portion 111 configured to hold the top portion 112, and a protrusion portion 113 configured to support the substrate W. The top portion 112 has a curved surface 21a on a side that abuts the substrate W when viewed in the direction of the rotational axis of the rotating table 3, and has a reduced portion 21b formed to be connected to an end of the curved surface 21a, when viewed in the direction of the rotational axis of the rotating table 3, such that the width of the reduced portion 21b in a direction perpendicular to a first direction facing away from the side that abuts the substrate W is continuously reduced from the boundary with the curved surface 21a along the first direction. In addition, the top portion 112 has a first sloping surface 21c formed to slope downward in the first direction when viewed in a direction that is perpendicular to the direction of the rotational axis of the rotating table 3 and perpendicular to the first direction. The protrusion portion 113 supports the substrate W such that the top surface 21e of the top portion 112 is flush with the upper surface of the substrate W in a state where the substrate W is grasped. Therefore, as in the case of the first embodiment, the substrate processing apparatus 1 according to the second embodiment can reduce the disturbance of air current generated at the rear side (downstream side) of the chuck pin 100, and can prevent mist of the processing liquid separated from each chuck pin 21 from scattering toward the substrate W after being thrown upward by the disturbance of the air current. As a result, the substrate processing apparatus 1 can suppress reattachment of the processing liquid to the substrate W, thereby improving the substrate quality.

In addition, according to the second embodiment, the chuck pin 100 may be formed by forming a curved surface 21a, a reduced portion 21b, and a first sloping surface 21c on the top portion of the chuck pin. That is, the chuck pin 100 can be formed by partially modifying an existing chuck pin, and the chuck pin according to the present embodiment can be easily realized.

Other Embodiments

The first and second embodiments have been described above in connection with a chuck mechanism configured to control the grasping and opening of a substrate W by rotating chuck pins. However, the embodiments are not limited thereto, and the substrate processing apparatus 1 may adopt a chuck mechanism based on another scheme. For example, it is also possible to use a chuck mechanism configured to control the grasping and opening of a substrate W by changing the inclination of chuck pins by an elastic member such as a spring or the like.

According to an aspect of the present disclosure, reattachment of a processing liquid to a substrate surface is suppressed, so that it is possible to improve the substrate quality.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a rotating table configured to rotate a substrate; and
a plurality of fixing members configured to fix the substrate on the rotating table by grasping the substrate while abutting an outer periphery of the substrate,
wherein each of the plurality of fixing members includes:
a curved surface on a side that abuts the substrate when viewed in a direction of a rotational axis of the rotating table;
a reduced portion formed to be connected to an end of the curved surface when viewed in the direction of the rotational axis of the rotating table, and having a width in a direction perpendicular to a first direction facing away from the side that abuts the substrate, which is continuously reduced in the first direction from a boundary with the curved surface;
a first sloping surface formed on a top portion to slope downwards in the first direction when viewed in a direction that is perpendicular to the direction of the rotational axis of the rotating table and perpendicular to the first direction; and
a support portion formed on the curved surface and configured to support the substrate such that a top surface of the top portion is flush with an upper surface of the substrate in a state where the substrate is grasped.

2. A substrate processing apparatus comprising:
a rotating table configured to rotate a substrate; and
a plurality of fixing members configured to fix the substrate on the rotating table by grasping the substrate while abutting an outer periphery of the substrate,
wherein each of the plurality of fixing members includes a top portion, a base portion configured to hold the top portion, and a support portion configured to support the substrate,
wherein the top portion includes:
a curved surface on a side that abuts the substrate when viewed in a direction of a rotational axis of the rotating table;
a reduced portion formed to be connected to an end of the curved surface when viewed in the direction of the rotational axis of the rotating table, and having a width in a direction perpendicular to a first direction facing away from the side that abuts the substrate, which is continuously reduced in the first direction from a boundary with the curved surface, and
a first sloping surface which slopes downwards in the first direction when viewed in a direction that is perpendicular to the direction of the rotational axis of the rotating table and perpendicular to the first direction, and
wherein the support portion is configured to support the substrate such that a top surface of the top portion is flush with an upper surface of the substrate in a state where the substrate is grasped.

3. The substrate processing apparatus of claim 1, wherein the top portion has a horizontal surface on a side that supports the substrate when viewed in the direction that is perpendicular to the direction of the rotational axis of the rotating table and perpendicular to the first direction, and
wherein the first sloping surface slopes downwards from an end of the horizontal surface in the first direction.

4. The substrate processing apparatus of claim 1, wherein a length of the first sloping surface in the first direction is at least half of a length of the top portion in the first direction.

5. The substrate processing apparatus of claim 1, wherein each of the plurality of fixing members is provided such that a direction of the reduced portion having a width continuously reduced in the first direction is parallel to a scattering direction of a processing liquid supplied to the substrate.

6. The substrate processing apparatus of claim 1, wherein each of the plurality of fixing members further includes a second sloping surface configured to slope downwards from an end of the first sloping surface in the first direction when viewed in the direction that is perpendicular to the direction of the rotational axis of the rotating table and perpendicular to the first direction.

7. The substrate processing apparatus of claim 2, wherein the top portion has a horizontal surface on a side that supports the substrate when viewed in the direction that is perpendicular to the direction of the rotational axis of the rotating table and perpendicular to the first direction, and
wherein the first sloping surface slopes downwards from an end of the horizontal surface in the first direction.

8. The substrate processing apparatus of claim 2, wherein a length of the first sloping surface in the first direction is at least half of a length of the top portion in the first direction.

9. The substrate processing apparatus of claim 2, wherein each of the plurality of fixing members is provided such that a direction of the reduced portion having a width continuously reduced in the first direction is parallel to a scattering direction of a processing liquid supplied to the substrate.

10. The substrate processing apparatus of claim 2, wherein each of the plurality of fixing members further includes a second sloping surface configured to slope downwards from an end of the first sloping surface in the first direction when viewed in the direction that is perpendicular to the direction of the rotational axis of the rotating table and perpendicular to the first direction.

* * * * *